United States Patent
Ahn et al.

(10) Patent No.: US 8,704,228 B2
(45) Date of Patent: Apr. 22, 2014

(54) ANTI-FUSE DEVICE AND SEMICONDUCTOR DEVICE AND SYSTEM INCLUDING THE SAME

(75) Inventors: Woo-song Ahn, Hwaseong-si (KR); Satoru Yamada, Seoul (KR); Young-jin Choi, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 101 days.

(21) Appl. No.: 13/328,097

(22) Filed: Dec. 16, 2011

(65) Prior Publication Data
US 2012/0153404 A1 Jun. 21, 2012

(30) Foreign Application Priority Data
Dec. 20, 2010 (KR) .................. 10-2010-0130942

(51) Int. Cl.
*H01L 29/04* (2006.01)
(52) U.S. Cl.
USPC .................................. 257/50; 257/E23.149
(58) Field of Classification Search
USPC ............ 438/131; 257/50, E29.123, E23.148, 257/E23.149
See application file for complete search history.

(56) References Cited

U.S. PATENT DOCUMENTS

| | | | |
|---|---|---|---|
| 7,790,517 B2 * | 9/2010 | Manabe et al. | 438/131 |
| 2006/0092742 A1 * | 5/2006 | Paillet et al. | 365/225.7 |
| 2007/0262415 A1 * | 11/2007 | Smith et al. | 257/530 |
| 2009/0184350 A1 | 7/2009 | Kodama et al. | |
| 2010/0165699 A1 * | 7/2010 | Chen et al. | 365/96 |
| 2011/0312175 A1 * | 12/2011 | Min et al. | 438/600 |

FOREIGN PATENT DOCUMENTS

| | | |
|---|---|---|
| JP | 2009-290189 A | 12/2009 |
| KR | 10-2004-008707 A | 1/2004 |
| KR | 10-2009-0103613 A | 10/2009 |

* cited by examiner

*Primary Examiner* — Caridad Everhart
(74) *Attorney, Agent, or Firm* — Lee & Morse, P.C.

(57) ABSTRACT

An anti-fuse device includes a gate electrode on a semiconductor substrate, a gate insulating layer between the semiconductor substrate and the gate electrode, junction regions in the semiconductor substrate adjacent the gate electrode, and at least one anti-breakdown material layer between the junction regions, the gate insulating layer being between the gate electrode and the anti-breakdown material layer.

20 Claims, 12 Drawing Sheets

ANTI-FUSE DEVICE AND SEMICONDUCTOR DEVICE AND SYSTEM INCLUDING THE SAME

CROSS-REFERENCE TO RELATED APPLICATIONS

Korean Patent Application No. 10-2010-0130942, filed on Dec. 20, 2010, in the Korean Intellectual Property Office, and entitled: "Anti-Fuse Device and Semiconductor Device and System Including the Same," is incorporated by reference herein in its entirety.

BACKGROUND

1. Field

The inventive concept relates to an anti-fuse device and a semiconductor device and system including the same, and more particularly, to an anti-fuse device and a semiconductor device and system including the same, which may be advantageous for reductions in chip size and costs and improve the current distribution characteristics of the anti-fuse device.

2. Description of the Related Art

The integration density and performance of semiconductor devices used for computers or mobile apparatuses are gradually increasing. The capacity and speed of a memory device including memory cells, as an example of a semiconductor device, are gradually increasing. Also, various attempts are being made at developing downscaled semiconductor devices including memory cells having high capacities and increasing the operating speed of semiconductor devices. Furthermore, an anti-fuse device, which is an electronic device capable of converting a nonconductive state into a conductive state, may be used for a redundancy programming or option programming in response to a programming voltage (or current) and electrical stress in such semiconductor devices.

SUMMARY

The inventive concept provides an anti-fuse device with an anti breakdown material layer capable of reducing chip size without an additional process, thereby reducing costs and improving current dispersion characteristics.

The inventive concept also provides a semiconductor device including the anti-fuse device fabricated without an additional process.

Furthermore, the inventive concept provides a system including the anti-fuse device.

According to an aspect of the inventive concept, there is provided an anti-fuse device, including a gate electrode on a semiconductor substrate, a gate insulating layer between the semiconductor substrate and the gate electrode, junction regions in the semiconductor substrate adjacent the gate electrode, and at least one anti-breakdown material layer between the junction regions, the gate insulating layer being between the gate electrode and the at least one anti-breakdown material layer.

The anti-breakdown material layer may include at least one of silicon oxide, silicon nitride, and silicon oxynitride.

The anti-breakdown material layer may be an ion implantation region having an opposite conductivity type to a conductivity type of the junction regions.

At least a portion of an upper edge of the anti-breakdown material layer may contact the junction regions.

An upper edge of the anti-breakdown material layer may be spaced apart from the junction regions.

At least portions of the junction regions may be overlapped by the gate electrode.

A portion of each of the junction regions may be overlapped by the gate electrode and gate insulation layer.

The overlap portion between the gate electrode and the junction regions may be configured to have a breakdown due to a pulse voltage equal to or higher than a rupture voltage applied to the gate electrode.

The gate insulating layer may overlap the anti-breakdown material layer, a width of the gate insulating layer being larger than a width of the anti-breakdown material layer.

At least two anti-breakdown material layers may be positioned in the semiconductor substrate between the junction regions.

A width of the anti-breakdown material layer may be about 60% or higher of a distance between the junction regions.

The anti-breakdown material layer may directly contact the gate insulating layer.

A top surface of the anti-breakdown material layer may protrude above a top surface of the semiconductor substrate.

A system may include a memory device including the anti-fuse device, and a microprocessor connected to the memory device through a system bus.

According to another aspect of the inventive concept, there is provided a semiconductor device, including a semiconductor substrate divided into a cell region and an anti-fuse region, the cell region including memory cells, and the anti-fuse region including anti-fuse devices, wherein each of the anti-fuse devices is connected to at least one memory cell and configured to enable the at least one memory cell by a breakdown, and wherein each of the anti-fuse devices includes a gate electrode on the semiconductor substrate, a gate insulating layer between the semiconductor substrate and the gate electrode, junction regions in the semiconductor substrate adjacent the gate electrode, and at least one anti-breakdown material layer between the junction regions, the gate insulating layer being between the gate electrode and the at lest one anti-breakdown material layer.

The memory cells may be isolated from one another by an isolation layer, and the isolation layer may have a same depth as the anti-breakdown material layer.

According to another aspect of the inventive concept, there is provided an anti-fuse device, including a gate electrode on a semiconductor substrate, a gate insulating layer between the semiconductor substrate and the gate electrode, junction regions in the semiconductor substrate adjacent the gate electrode, and at least one anti-breakdown material layer in the semiconductor substrate, the gate insulating layer overlapping and contacting at least a portion of the anti-breakdown material layer.

The anti-breakdown material layer may be between the junctions regions.

The gate insulation layer may directly contact the anti-breakdown material layer.

The anti-breakdown material layer may extend in an entire distance between the junctions regions to contact the junctions regions.

The gate insulation layer may overlap the entire anti-breakdown material layer and at least a portion of at least one of the junction regions.

BRIEF DESCRIPTION OF THE DRAWINGS

Features and advantages will become apparent to those of ordinary skill in the art by describing in detail exemplary embodiments with reference to the attached drawings, in which.

DETAILED DESCRIPTION

Figure 1A:
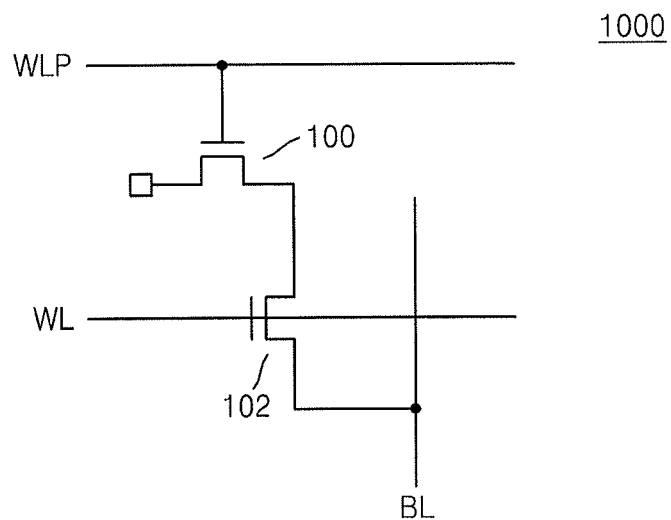
FIG. 1A illustrates a circuit diagram of an anti-fuse unit according to an exemplary embodiment of the inventive concept.

The inventive concept will now be described more fully hereinafter with reference to the accompanying drawings, in which exemplary embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art.

In the drawings, the dimensions of layers and regions may be exaggerated for clarity. It will also be understood that when a layer (or element) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will also be understood that although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 1B:
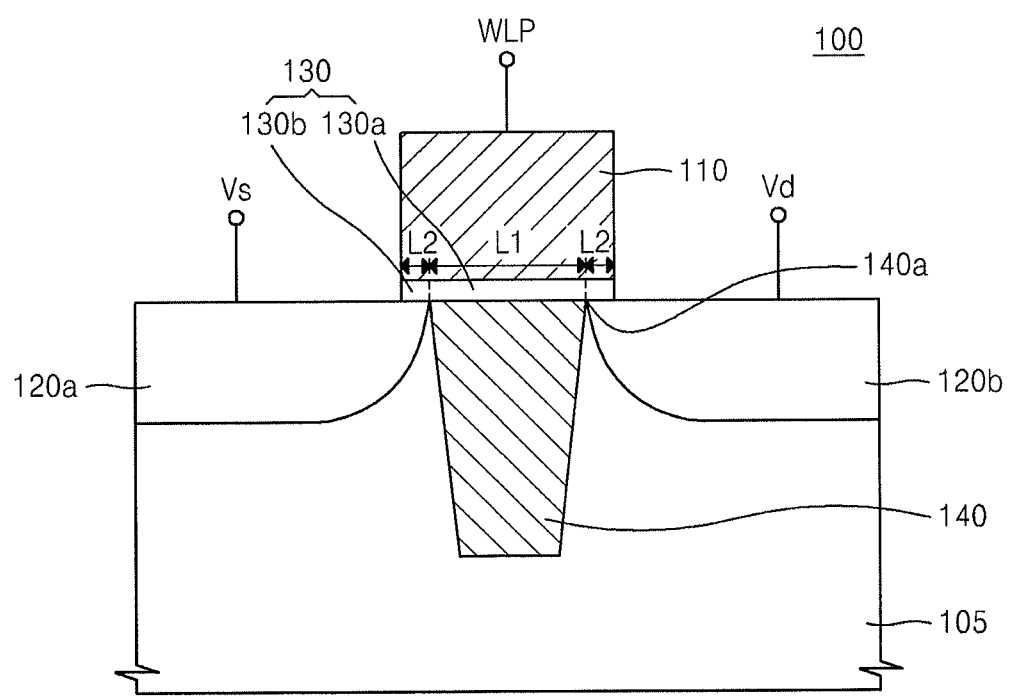
FIG. 1B illustrates a cross-sectional view of an anti-fuse device according to an exemplary embodiment of the inventive concept.

FIG. 1A is a circuit diagram of an anti-fuse unit 1000 including an anti-fuse device 100 according to an exemplary embodiment of the inventive concept. FIG. 1B is a detailed cross-sectional view of the anti-fuse device 100 of the anti-fuse unit 1000 of FIG. 1A.

Referring to FIG. 1A, a single anti-fuse unit 1000 may be configured by combining a single anti-fuse device 100 with a single selection transistor 102. As shown in FIG. 1A, the anti-fuse device 100 of the anti-fuse unit 1000 may be embodied using a metal-oxide-semiconductor field-effect transistor (MOSFET). A gate electrode of the anti-fuse device 100 may receive a high voltage WLP, one terminal of the anti-fuse device 100 may be connected to one terminal of the selection transistor 102, and the other terminal of the anti-fuse device 100 may be floated. Also, a gate electrode of the selection transistor 102 may be connected to a word line WL, and the other terminal of the selection transistor 102 may be connected to a bit line BL. A breakdown operation of a dielectric layer (not shown) of the anti-fuse device 100 may occur depending on conditions of the high voltage WLP, a voltage of the word line WL, and a voltage of the bit line BL, thereby enabling a programming operation.

Referring to FIG. 1B, a gate electrode 110 may be disposed on a semiconductor substrate 105 by interposing a gate insulating layer 130 therebetween. Also, junction regions 120a and 120b may be disposed on both sides of the gate electrode 110. The junction regions 120a and 120b may be respectively source and drain regions of the anti-fuse device 100.

An anti-breakdown material layer 140 may be disposed between the junction regions 120a and 120b under the gate electrode 110. That is, the anti-breakdown material layer 140 may be formed in the semiconductor substrate 105, e.g., the anti-breakdown material layer 140 may extend from a top surface of the semiconductor substrate 105 to a predetermined depth within the semiconductor substrate 105. A top surface of the anti-breakdown material layer 140 may be substantially level with top surfaces of the junction regions 120a and 120b and may define the top surface of the semiconductor substrate 105. For example, the anti-breakdown material layer 140 may contact each of the junction regions 120a and 120b, e.g., a width of the anti-breakdown material layer 140 may extend between the regions 120a and 120b to fill and substantially equal a distance between the regions 120a and 120b. The width of the anti-breakdown material layer 140 may equal the width L1.

The gate insulating layer 130 may be between, e.g., directly between, the anti-breakdown material layer 140 and the gate electrode 110, and the gate insulating layer 130 may overlap, e.g., completely overlap, the anti-breakdown material layer 140. For example, a central portion 130a of the gate insulating layer 130, i.e., corresponds to width L1, may completely overlap the anti-breakdown material layer 140, and peripheral portions 130b of the gate insulating layer 130, i.e., corresponds to width L2, may extend from each end of the central portion 130a to overlap a respective one of the junction regions 120a and 120b. The portions 130a and 130b of the gate insulating layer 130 may be continuous with each other, e.g., to define a single linear layer.

For example, the semiconductor substrate 105 may be a silicon substrate or a substrate formed of, e.g., at least one of silicon carbide, silicon germanium, indium arsenide, indium phosphide, a gallium-arsenic compound, a gallium-indium compound, etc. In another example, the semiconductor substrate 105 may be a silicon-on-insulator (SOI) substrate. In yet another example, the semiconductor substrate 105 may be lightly doped with p- or n-type impurities.

As the anti-breakdown material layer 140 is formed in the semiconductor substrate 105 between the junction regions 120a and 120b, the anti-breakdown material layer 140 may prevent formation of continuous channels between the junction regions 120a and 120b. For example, the anti-breakdown material layer 140 may be formed of at least one of silicon oxide, silicon nitride, and silicon oxynitride. However, materials forming the anti-breakdown material layer 140 according to the inventive concept are not limited thereto, and the anti-breakdown material layer 140 may be formed of any material having an insulation characteristic adapted to prevent occurrence of a breakdown between the anti-breakdown material layer 140 and the gate electrode 110.

In another example, the anti-breakdown material layer 140 may be an ion implantation region heavily doped with impurities of a same conductivity type as that of the semiconductor substrate 105. The impurities implanted into the ion implantation region, i.e., into the anti-breakdown material layer 140, may not necessarily be the same impurities doped into the semiconductor substrate 105 but may have the same conductivity type as the impurities doped into the semiconductor substrate 105. For example, when the anti-breakdown material layer 140 is an ion implantation region, a dopant concentration therein may be about $1 \times 10^{19}$ ions/cm$^2$. It is noted that when the ion implantation region is used as the anti-breakdown material layer 140, even if the high voltage WLP is applied to the gate electrode 110, formation of a channel may be suppressed in a region where the anti-breakdown material layer 140 is disposed.

Although the gate insulating layer 130 may be formed of a transitional metal oxide, e.g., silicon oxide or hafnium oxide, the inventive concept is not limited thereto. To obtain a high-quality gate insulating layer 130, the gate insulating layer 130 may be formed on the semiconductor substrate 105 using a low-pressure chemical vapor deposition (LPCVD) process, a plasma-enhanced CVD (PECVD) process, a metal organic CVD (MOCVD) process, a molecular beam epitaxy (MBE) process, a rapid thermal CVD (RTCVD) process, a limited reactive processing CVD (LRP-CVD) process, an atomic layer deposition (ALD) process, an ion beam deposition (IBD) process, or an electron-beam-induced deposition (EBID) process. For example, when the semiconductor substrate 105 is a silicon substrate, gate insulating layer 130 may be formed using a thermal oxidation process.

The gate electrode 110 may be formed of poly-Si, a metal, e.g., at least one of copper (Cu), platinum (Pt), silver (Ag), gold (Au), ruthenium (Ru), iridium (Ir), rhodium (Rh), rhenium (Re), and an aluminum-copper (AlCu) alloy, etc., a metal nitride, e.g., aluminum nitride (AlN) or tungsten nitride (WN), a metal silicide, e.g., WSi or PtSi, carbon nanotubes, or a combination thereof. The gate electrode 110 may be formed using a sputtering process, an LPCVD process, a PECVD process, an MOCVD process, a MBE process, an RTCVD process, an LRP-CVD process, an ALD process, an IBD process, or an EBID process.

The junction regions 120a and 120b may be ion implantation regions heavily doped with appropriate impurities. In particular, the junction regions 120a and 120b may exhibit an opposite conductivity type with respect to the semiconductor substrate 105. For example, when the semiconductor substrate 105 has a p conductivity type, the junction regions 120a and 120b may have an n conductivity type. Conversely, when the semiconductor substrate 105 has an n conductivity type, the junction regions 120a and 120b may have a p conductivity type.

The n-type impurities may be, e.g., phosphorus (P) ions, arsenic (As) ions, bismuth (Bi) ions, and/or antimony (Sb) ions, but the inventive concept is not limited thereto. The p-type impurities may be, e.g., boron (B) impurities, aluminum (Al) impurities, indium (In) impurities, and/or gallium (G) impurities, but the inventive concept is not limited thereto. The junction regions 120a and 120b may have a dopant concentration of about $1 \times 10^{19}$ ions/cm$^2$.

Hereinafter, functions of an anti-fuse device 100 according to an exemplary embodiment of the inventive concept will be described.

Referring to FIG. 1B, when a high voltage WLP equal to or higher than a rupture voltage is applied as a pulse type to the gate electrode 110, while grounding any one of junction regions 120a and 120b of the anti-fuse device 100 according to the inventive concept, a breakdown may occur in the portion 130b of the gate insulating layer 130, i.e., a portion not overlapping the anti-breakdown material 140, to form an electrical conduction path. In this case, since the breakdown occurs only in a very limited portion 130b, i.e., portion 130a overlapping the anti-breakdown material 140 continues functioning as an insulator, device characteristics between broken-down anti-fuses may have a very narrow distribution. The rupture voltage may depend on materials used for fabrication of the anti-fuse device 100 and dimensions and arrangements of respective components of the anti-fuse device 100. For example, the rupture voltage may range from about 6 V to about 10V.

In contrast, when a high voltage WLP equal to or higher than a rupture voltage is applied as a pulse type to a gate electrode of a conventional anti-fuse device, i.e., a device without the anti-breakdown material layer 140, while grounding any one of an adjacent junction regions, a breakdown may occur in an entire gate insulating layer separating the gate electrode from the junctions regions. As such, device characteristics between broken-down anti-fuses may have a wide distribution. Accordingly, as compared to the conventional anti-fuse device, the anti-fuse device 100 of FIG. 1B may exhibit remarkably improved device characteristics, e.g., the anti-fuse device 100 may be programmed with lower power consumption as compared to the conventional anti-fuse device.

As discussed previously, referring to FIG. 1B, at least portions of the junction regions 120a and 120b may be overlapped by the gate electrode 110 under the gate electrode 110, i.e., via the gate insulating layer 130 (refer to L2). In this case, a breakdown may occur in an overlap region between the gate electrode 110 and the junction regions 120a and 120b, i.e., regions corresponding to or overlapping portion 130b in FIG. 1B. Also, when only one of the junction regions 120a and 120b formed on both sides of the gate electrode 110 is partially overlapped by the gate electrode 110, i.e., when portion 130b overlaps only one of the junction regions 120a and 120b, the junction region including portion 130b may need to be grounded during application of the high voltage WLP to the gate electrode 110 to cause a breakdown.

Alternatively, at least a portion of each of the junction regions 120a and 120b may be overlapped by the gate electrode 110 under the gate electrode 110. In other words, portion 130b of FIG. 1B may be formed to overlap each one of the junction regions 120a and 120b. In this case, any one of the two junction regions 120a and 120b may be grounded when high voltage WLP is applied.

Figure 2:
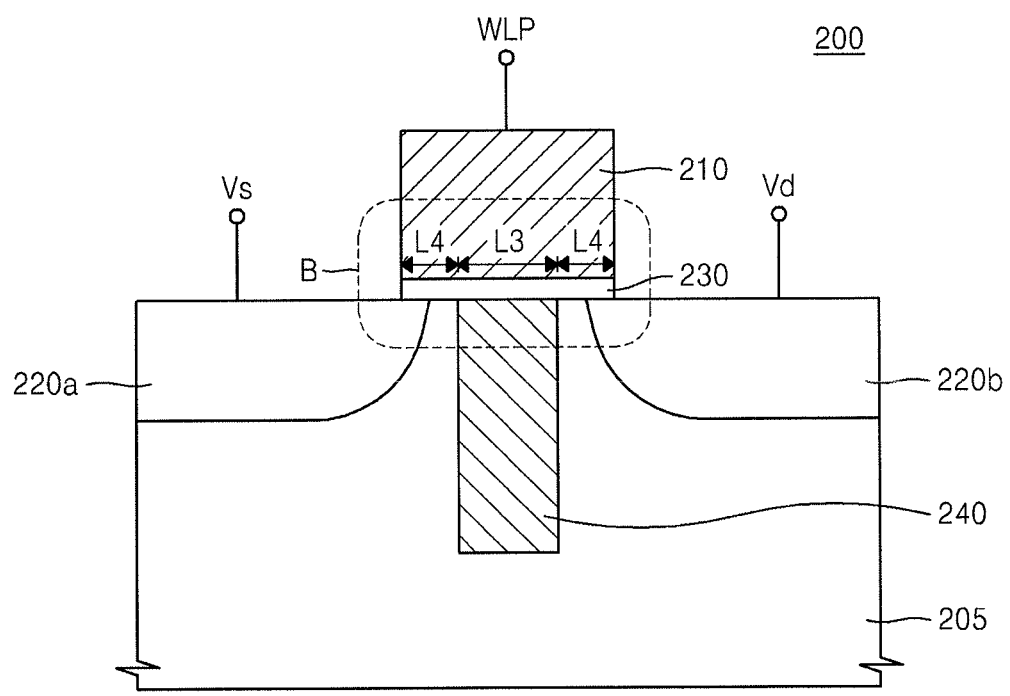
FIG. 2 illustrates a cross-sectional view of an anti-fuse device according to another exemplary embodiment of the inventive concept.

FIG. 2 is a cross-sectional view of an anti-fuse device 200 according to another exemplary embodiment of the inventive concept. Referring to FIG. 2, a gate electrode 210 may be disposed on a semiconductor substrate 205 by interposing a gate insulating layer 230 therebetween. Also, junction regions 220a and 220b may be formed on both sides of the gate electrode 210. An anti-breakdown material layer 240 may be formed under the gate electrode 210 between the junction regions 220a and 220b. The same descriptions of the semiconductor substrate 205, the gate electrode 210, the gate insulating layer 230, the junction regions 220a and 220b, and the anti-breakdown material layer 240 of FIG. 2 as those of the corresponding elements of FIG. 1B will be omitted.

At least a portion of an upper edge 140a of the anti-breakdown material layer 140 of FIG. 1B may be in contact with the junction regions 220a and 220b. In contrast, an upper edge 240a of the anti-breakdown material layer 240 of FIG. 2 may be separated, e.g., spaced a predetermined distance apart, from each of the junction regions 220a and 220b. In other words, a width of the anti-breakdown material layer 240 may be smaller than a distance between the junction regions 220a and 220b, so a portion of the semiconductor substrate 205 may be positioned between the anti-breakdown material layer 240 and each of the junction regions 220a and 220b, i.e., the anti-breakdown material layer 240 may not contact the junction regions 220a and 220b.

In FIG. 2, reference numerals L3 and L4 respectively denote the width of the anti-breakdown material layer 240 and a distance between one end of the gate electrode 210 and the anti-breakdown material layer 240. It is noted that if widths of the gate electrodes 110 and 210 in respective FIGS. 1B and 2 are the same, and positions of the junction regions 120a/120b and 220a/220b in respective FIGS. 1B and 2 are the same, width L1 is larger than width L3.

In detail, as described above, the gate insulating layer 230 may not be broken down in a region where the anti-breakdown material layer 240 is disposed, i.e., a region having a width L3 and overlapping the anti-breakdown material layer 240. Accordingly, in the gate insulating layer 230 of FIG. 2, a range where a breakdown occurs may be limited to regions of the gate insulating layer 230 corresponding to width L4, as will be discussed in more detail with reference to FIG. 3.

Figure 3:
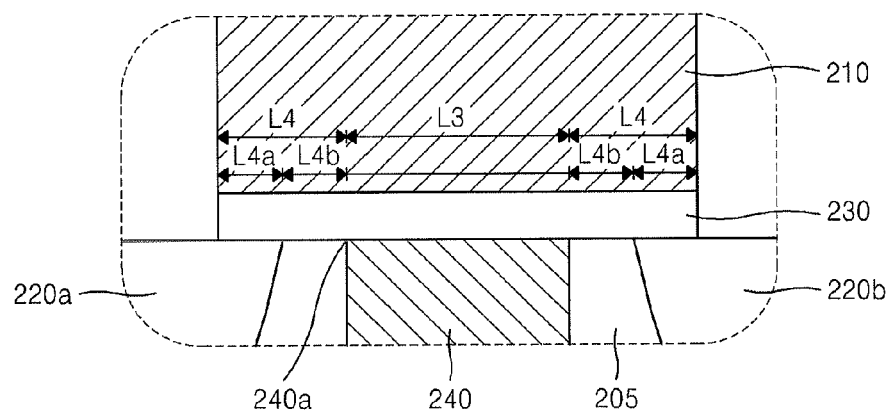
FIG. 3 illustrates an enlarged view of a portion B of FIG. 2.

FIG. 3 is an enlarged view of a portion B of FIG. 2, which is provided for explaining a breakdown of the anti-fuse device 200 of FIG. 2 in further detail. Referring to FIG. 3, a region of the gate insulating layer 230 corresponding to the width L4, i.e. a region overlapping a portion indicated as L4, may be divided into regions L4a and L4b. Region L4a may extend from an edge of the gate electrode 210 to a corresponding edge of one of the junction regions 220a and 220b, and region L4b may extend from the edge of the corresponding junction region 220a or 220b to an upper edge of the anti-breakdown material layer 240. In other words, region L4a refers to a portion of the gate insulating layer 230 overlapping the junction region 220a or 220b, and region L4b refers to a portion of the gate insulating layer 230 overlapping a portion of the semiconductor substrate 205 between the anti-breakdown material layer 240 and a corresponding one of the junctions 220a and 220b. When a pulse voltage equal to or higher than a rupture voltage is applied to the gate electrode 210, a breakdown may occur in the region L4a or the region L4b, which is a portion of a channel region.

As shown in FIG. 1B, when the width of the anti-breakdown material layer 140 equals a distance between the junction regions 120a and 120b, a breakdown occurs only in an overlap region between the gate electrode 210 and the junction regions 120a and 120b. According to the exemplary embodiment illustrated in FIGS. 2-3, when the width of the anti-breakdown material layer 240 is smaller than the distance between the junction regions 220a and 220b, a breakdown may occur also in the region L4b of the channel region, i.e., an overlap region of the gate electrode 210 with the semiconductor substrate 205.

For example, if the breakdown occurs in the region L4b of the channel region, since a distance between the region L4b, i.e., where the breakdown occurs, and each of the junction regions 220a and 220b is very small, a driving current may only slightly increase compared to when the breakdown occurs in the overlap region L4a. Also, when the breakdown occurs in the region L4b, a current distribution may relatively increase within only a small range as compared with the case of FIG. 1B. Thus, when the breakdown occurs in the region L4b, a current distribution may be relatively markedly reduced, as compared to a conventional anti-fuse device without an anti-breakdown material layer, e.g., where the breakdown occurs in the entire gate insulation layer including a middle portion of the channel region.

The width of the anti-breakdown material layer 240, i.e., the width L3, may be about 60% or higher of a distance between the junction regions 220a and 220b. In other words, the width L3 may be about 60% or higher than a sum of L3 and two L4b.

Figure 4:
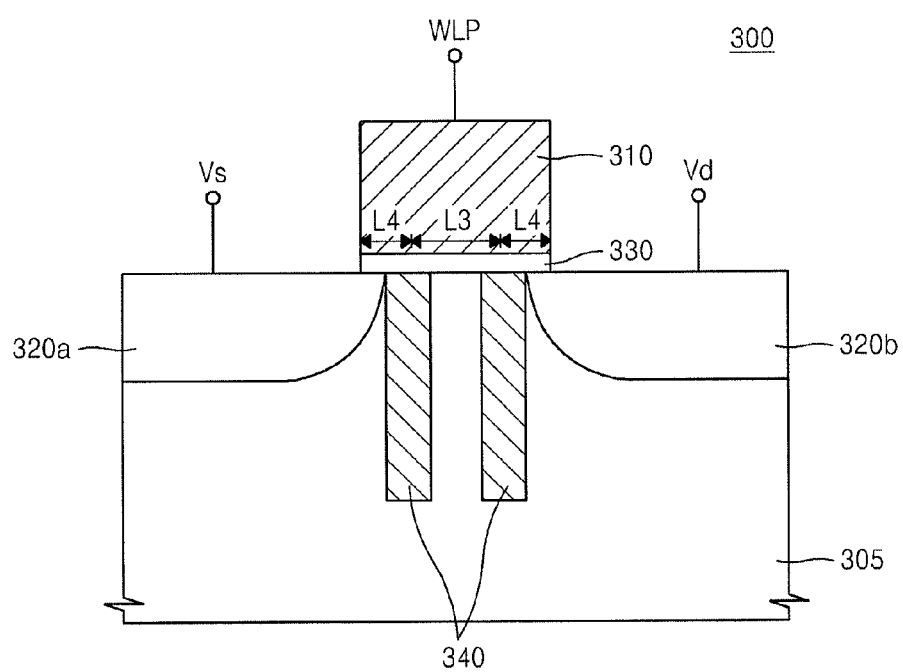
FIG. 4 illustrates a cross-sectional view of an anti-fuse device according to another exemplary embodiment of the inventive concept.

FIG. 4 is a cross-sectional view of an anti-fuse device 300 according to another exemplary embodiment of the inventive concept. Referring to FIG. 4, a gate electrode 310 may be disposed on a semiconductor substrate 305 by interposing a gate insulating layer 330 therebetween. Also, junction regions 320a and 320b may be formed in the semiconductor substrate 305 on both sides of the gate electrode 310.

At least two anti-breakdown material layers 340 may be formed under the gate electrode 310 between the junction regions 320a and 320b. As shown in FIG. 4, a plurality of anti-breakdown material layers 340, i.e., at least two anti-breakdown material layers 340, may be formed in the semiconductor substrate 305. For example, the two anti-breakdown material layers 340 may be spaced apart from each other to have a portion of the semiconductor substrate 305 therebetween. For example, the anti-breakdown material layers 340 may or may not contact the junction regions 320a and 320*b*. Although the semiconductor substrate 305 faces the gate electrode 310 across the gate insulating layer 330 in a space region between the anti-breakdown material layers 340, the anti-breakdown material layers 340 may prevent the formation of a channel in the space region. As a result, no breakdown may occur in the space region between the anti-breakdown material layers 340. In other words, portions of the gate insulating layer 330 directly overlapping the anti-breakdown material layers 340 may not breakdown upon high voltage application to the gate electrode 310, i.e., breakdown may occur only at regions of the gate insulating layer 330 directly contacting the semiconductor substrate 305 or the junction regions 320*a*/320*b*.

The same descriptions of the semiconductor substrate 305, the gate electrode 310, the gate insulating layer 330, the junction regions 320*a* and 320*b*, and the anti-breakdown material layer 340 of FIG. 4 as those of the corresponding elements of FIG. 1B will be omitted.

Figure 5:
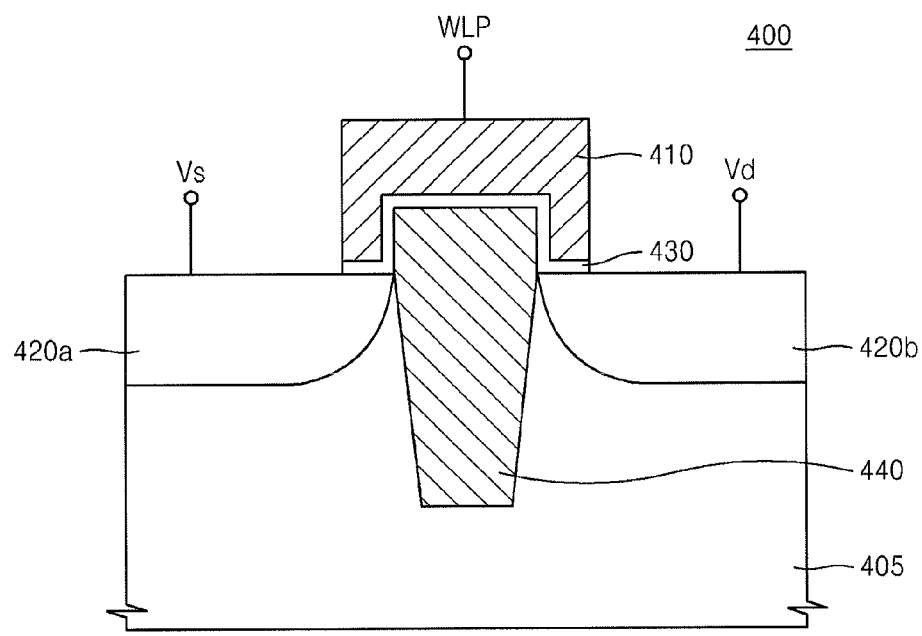
FIG. 5 illustrates a cross-sectional view of an anti-fuse device according to another exemplary embodiment of the inventive concept.

FIG. 5 is a cross-sectional view of an anti-fuse device 400 according to still another exemplary embodiment of the inventive concept. Referring to FIG. 5, a gate electrode 410 may be disposed on a semiconductor substrate 405 by interposing a gate insulating layer 430 therebetween. Also, junction regions 420*a* and 420*b* may be formed on both sides of the gate electrode 410.

An anti-breakdown material layer 440 may be formed under the gate electrode 410 between the junction regions 420*a* and 420*b*. In particular, a top surface of the anti-breakdown material layer 440 may protrude upward from a top surface of the semiconductor substrate 405. In other words, a first portion of the anti-breakdown material layer 440 may extend to a predetermined depth within the semiconductor substrate 405, and a second portion of the anti-breakdown material layer 440 may extend vertically above the top surface of the semiconductor substrate. For example, at least two anti-breakdown material layers 440 may be provided to extend about the top surface of the semiconductor substrate. When the anti-breakdown material layer 440 extends above the semiconductor substrate 405, the gate insulation layer 430 and the gate electrode 410 may be conformally formed on the protruding portion of the anti-breakdown material layer 440.

The same descriptions of the semiconductor substrate 405, the gate electrode 410, the gate insulating layer 430, the junction regions 420*a* and 420*b*, and the anti-breakdown material layer 440 of FIG. 5 as those of the corresponding elements of FIG. 1B will be omitted.

Figure 6:
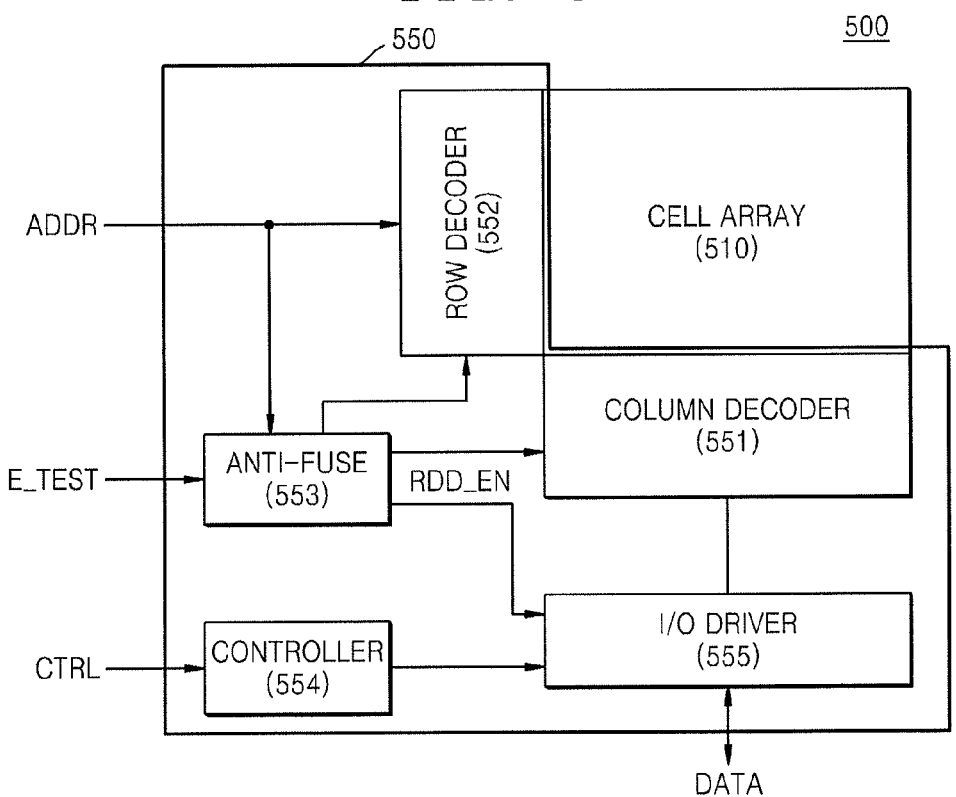
FIG. 6 illustrates a block diagram of a semiconductor device according to an exemplary embodiment of the inventive concept.

FIG. 6 is a block diagram of a semiconductor device 500 according to an exemplary embodiment of the inventive concept. Referring to FIG. 6, the semiconductor device 500 may include a cell region 510, i.e., a cell array 510, and a peripheral region 550. The cell region 510 may include a plurality of memory cells arranged in columns and rows and connected to one another by a plurality of word lines and a plurality of bit lines. Components other than the memory cells may be integrated in the peripheral region 550.

In particular, the peripheral region 550 may include a column decoder 551 connected to bit lines of the cell region 510, a row decoder 552 connected to word lines of the cell region 510, an anti-fuse region 553 including anti-fuse devices, a controller 554, and an input/output (I/O) driver 555.

The anti-fuse region 553 may repair a defective bit line connected to a defective main memory cell by a redundancy line (not shown) in response to an address signal ADDR and enable a redundancy enable signal RDD_EN when at least one bit line is repaired. Each of the anti-fuse devices may be connected to at least one memory cell and enable the at least one memory cell due to a breakdown as needed to perform a repair operation. Also, since the anti-fuse devices are explained above in detail, a detailed description thereof will be omitted here.

The I/O driver 555 may convert data output from the cell region into a predetermined value in response to the redundancy enable signal RDD_EN in a test mode and output the predetermined value as output data.

In FIG. 6, the redundancy enable signal RDD_EN may be enabled during the enabling of a test mode signal E_TEST when any one of a defective row address and/or a defective column address stored therein is equal to the address signal ADDR input from a test device (not shown), and transmitted to the I/O driver 555.

During the enabling of the redundancy enable signal RDD_EN, the I/O driver 555 may output a failure data signal having a predetermined level as an output data signal DATA instead of a data signal output from the cell region 510 through the column decoder 551 to the test device. For example, during the enabling of the redundancy enable signal RDD_EN, the output data signal DATA output from the cell region 510 may be at a low level.

To test the semiconductor device 500 having the above-described configuration of FIG. 6, during a first test operation, the test device (not shown) may check whether the cell region 510 is defective and may program address data regarding a defective bit line or defective word line related to a defective cell in the anti-fuse region 553.

During a second test operation, the test device may enable a test mode signal E_TEST and test the defective bit line or defective word line. When an address signal ADDR is equivalent to the address data regarding the defective bit line or defective word line stored in the anti-fuse region 553, the anti-fuse region 553 of the semiconductor device 500 may enable a redundancy enable signal RDD_EN. Afterwards, the I/O driver 555 may set an output data signal DATA to a low level when the redundancy enable signal RDD_EN is enabled.

When all data signals DATA output from the defective bit line or defective word line of the semiconductor device 500 are at a low level, the test device may determine that the anti-fuse device 553 is normally programmed.

Figure 7:
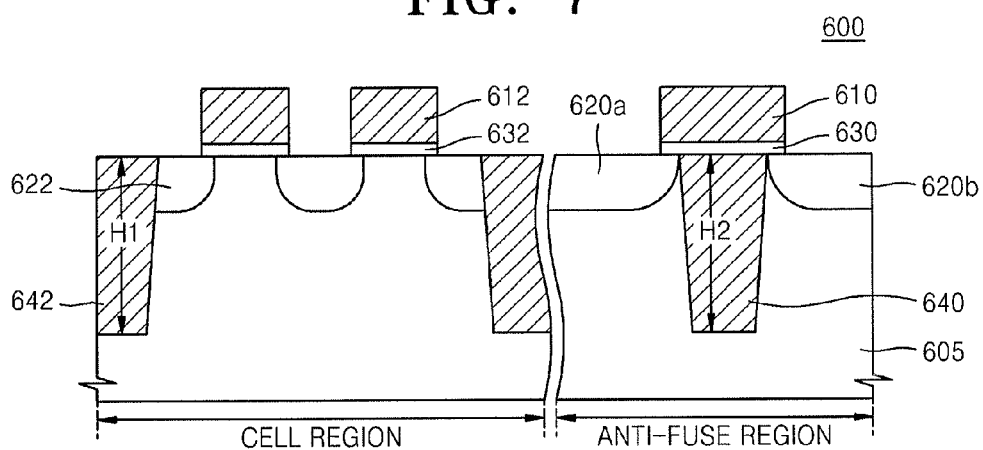
FIG. 7 illustrates a cross-sectional view of a semiconductor device with a cell region and an anti-fuse region according to an exemplary embodiment of the inventive concept.

FIG. 7 is a cross-sectional view of a single semiconductor substrate 605 in which both a cell region and an anti-fuse region are formed. Referring to FIG. 7, a transistor including a gate electrode 612, a gate insulating layer 632, and a junction region 622 may be formed on an active region defined by a cell-region isolation layer 642 in the cell region. Also, a gate electrode 610 may be disposed on the semiconductor substrate 605 by interposing a gate insulating layer 630 therebetween in the anti-fuse region. Also, junction regions 620*a* and 620*b* may be formed on both sides of the gate electrode 610.

An anti-breakdown material layer 640 may be formed under the gate electrode 610 between the junction regions 620*a* and 620*b*. The anti-breakdown material layer 640 may have the same depth as the cell-region isolation layer 642, as shown FIG. 7. In other words, H1, i.e., depth of the cell-region isolation layer 642 may substantially equal H2, i.e., depth of the anti-breakdown material layer 640. In particular, the anti-breakdown material layer 640 may be formed of the same material as the cell-region isolation layer 642. For example, the anti-breakdown material layer 640 and the cell-region isolation layer 642 may be formed of silicon oxide ($SiO_2$).

Hereinafter, a method of fabricating an anti-fuse device according to an exemplary embodiment of the inventive concept will be described with reference to FIGS. 8A through 8D, which are lateral cross-sectional views of stages in a method of fabricating an anti-fuse device according to an exemplary embodiment of the inventive concept.

Figure 8A:
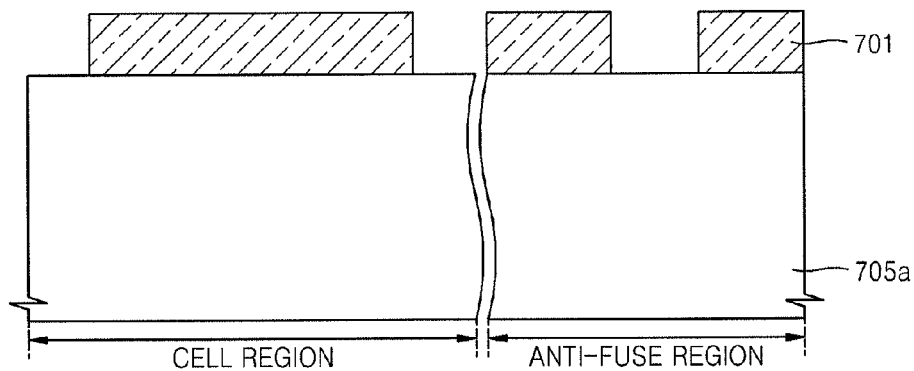
FIGS. 8A through 8D illustrate lateral cross-sectional views of stages in a method of fabricating an anti-fuse device according to an exemplary embodiment of the inventive concept.

Referring to FIG. 8A, a photoresist (PR) material layer may be coated on a semiconductor substrate 705a and processed using exposure and developing processes, thereby forming a PR mask 701. The PR mask 701 may expose a region where an isolation layer will be formed and a region where an anti-breakdown material layer will be formed.

FIG. 8A shows a case where only a PR material layer is used as a mask material layer. However, in some cases, before a recess (not shown) required for forming an isolation layer and/or an anti-breakdown material layer is normally formed, the entire PR mask 701 may be etched and lost. In this case, a hard mask material layer may be interposed between the PR material layer and the semiconductor substrate 705a, thereby forming a hard mask pattern.

The hard mask material layer may be formed of at least one of tungsten (W), titanium (Ti), titanium nitride (TiN), titanium dioxide ($TiO_2$), zirconium dioxide ($ZrO_2$), aluminum oxide ($Al_2O_3$), aluminum oxynitride (AlON), hafnium dioxide ($HfO_2$), amorphous carbon, silicon nitride ($Si_3N_4$), silicon oxynitride (SiON), and a combination thereof. By use of the hard mask material layer, a pattern of the formed PR mask 701 may be appropriately transferred to an underlying hard mask. The hard mask material layer may include a multilayered layer as needed.

Figure 8B:
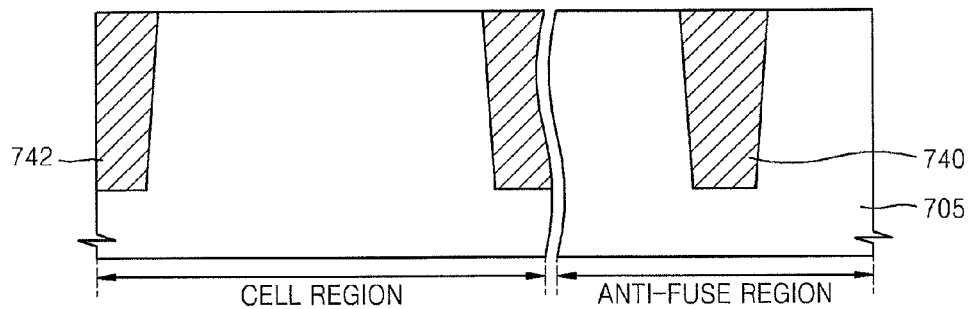

Referring to FIG. 8B, the semiconductor substrate 705a may be etched using the PR mask 701, thereby forming a recess. The recess may correspond to a position where an isolation layer defining an active region will be formed in a cell region and correspond to a position where an anti-breakdown material layer will be formed in an anti-fuse region.

Next, an insulating material may be deposited on the entire surface of the semiconductor substrate 705 and planarized to define the active region. As a result, an isolation layer 742 defining the active region may be formed in the recesses of the cell region, while an anti-breakdown material layer 740 may be formed in a recess of the anti-fuse region. Since the isolation layer 742 and the anti-breakdown material layer 740 are simultaneously formed using the same process, the isolation layer 742 and the anti-breakdown material layer 740 may be formed of the same material to the same depth. Accordingly, the anti-breakdown material layer 740 may be formed without an additional process.

However, the inventive concept is not limited thereto, and the isolation layer 742 and the anti-breakdown material layer 740 may not be necessarily formed at the same time but be formed of different materials to different sizes using different processes.

When the anti-breakdown material layer 740 is a region heavily doped with impurities of the same conductivity as the semiconductor substrate 705 as described above, an additional ion implantation process may be required. In this case, since a recess should not be formed in the anti-fuse region, the anti-fuse region should be completely covered with the PR mask unlike shown in FIG. 8A. Also, in an additional process, the anti-breakdown material layer 740 may be formed by implanting ions using an additional PR mask configured to expose a position where the anti-breakdown material layer 740 will be formed.

The insulating material may be deposited using an LPCVD process, a PECVD process, an MOCVD process, a MBE process, an RTCVD process, an LRP-CVD process, an ALD process, an IBD process, or an EBID process. Also, the planarization process may be performed using, for example, a chemical mechanical polishing (CMP) or an etchback process. The insulating material may be, e.g., silicon oxide, silicon nitride, or silicon oxynitride, but the inventive concept is not limited thereto.

Figure 8C:
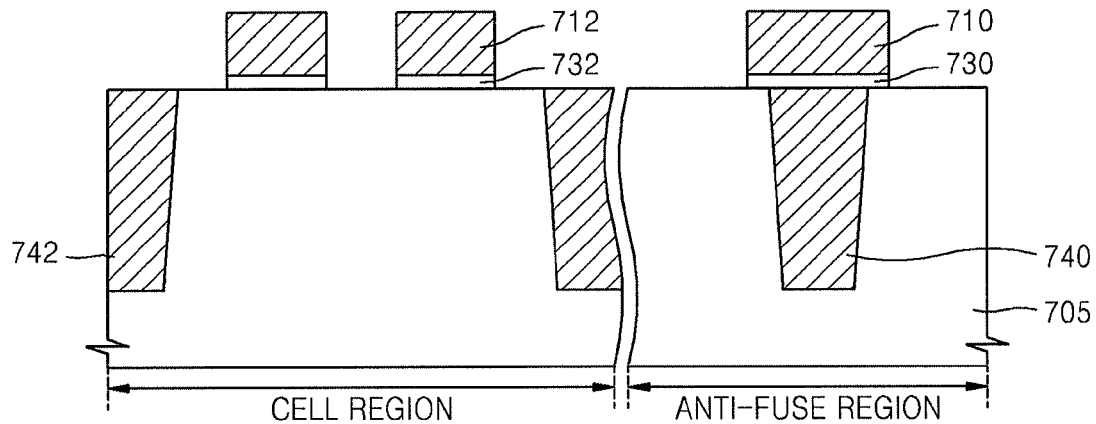

Referring to FIG. 8C, a gate insulating material layer and a gate material layer may be formed on the planarized surface of the semiconductor substrate 705 and processed using a photolithography process, thereby forming gate electrodes 710 and 712 and gate insulating layers 730 and 732 in a self-aligned manner. Each of the gate insulating material layer and the gate material layer may be formed using an LPCVD process, a PECVD process, an MOCVD process, a MBE process, an RTCVD process, an LRP-CVD process, an ALD process, an IBD process, or an EBID process.

The gate insulating layers 730 and 732 may be formed of a high-k dielectric material, e.g., silicon oxide or hafnium oxide. The gate electrodes 710 and 712 may be formed of poly-Si, a metal, e.g., at least one of Cu, Pt, Ag, Au, Ru, Ir, Rh, Re, and a AlCu alloy, a metal nitride, e.g., AlN and/or WN, a metal silicide, e.g., WSi and/or PtSi, carbon nanotubes, or a combination thereof.

Figure 8D:
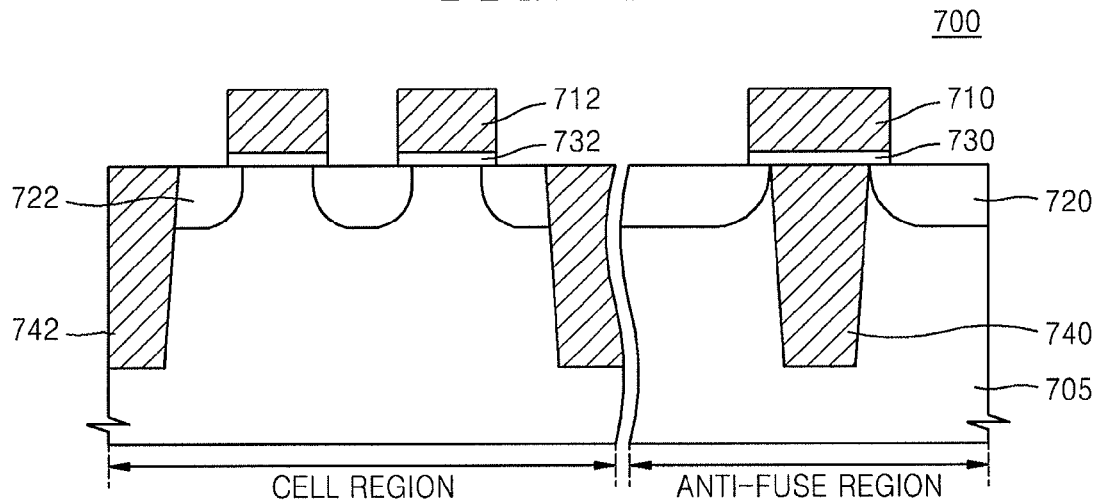

Referring to FIG. 8D, impurities may be implanted into an active region using the gate electrodes 710 and 712 as an ion implantation mask and diffused, thereby forming junction regions 720 and 722. The formation of the junction regions 720 and 722 may be performed using a lightly doped drain (LDD) process. Specifically, the formation of the junction regions 720 and 722 may include lightly doping impurities using the gate electrodes 710 and 712 as an ion implantation mask, forming spacers (not shown) on lateral surfaces of the gate electrodes 710 and 712, and heavily doping impurities using the gate electrodes 710 and 712 and the spacers as an ion implantation mask to form LDD regions.

The doped ions may be diffused using, for example, an annealing process, thereby forming junction regions 720 and 722 overlapped by the gate electrodes 710 and 712.

Although FIG. 8D illustrates that the upper edge of the anti-breakdown material layer 740 contacts the junction regions 720 and 722 in the anti-fuse region, the upper edge of the anti-breakdown material layer 740 may not directly contact the junction regions 720 and 722 but be spaced a predetermined distance apart from the junction regions 720 and 722 according to the diffusion rate of the doped impurities or the width of the anti-breakdown material layer 740 (refer to FIG. 2).

Figure 9:
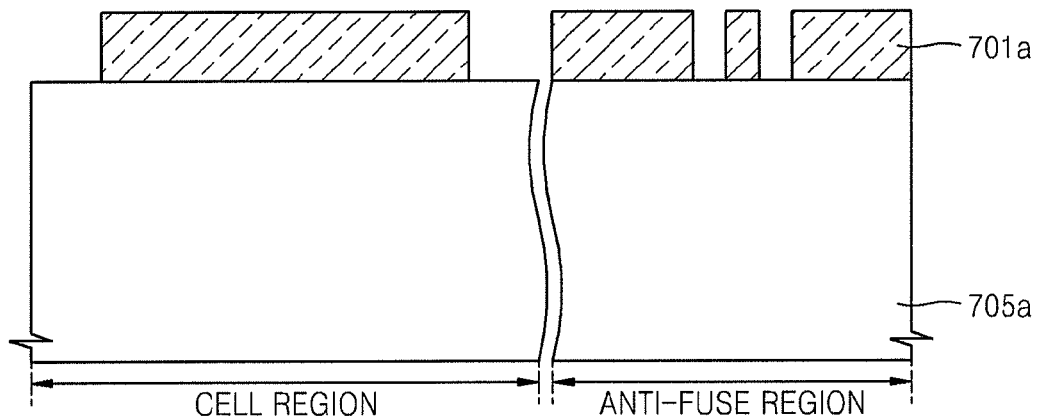
FIG. 9 illustrates a lateral cross-sectional view of a photoresist (PR) mask required for forming two anti-breakdown material layers according to an exemplary embodiment of the inventive concept.

When it is intended to form at least two anti-breakdown material layer 740 as shown in FIG. 4, a PR mask 701a of FIG. 9 may be provided instead of the PR mask 701 of FIG. 8A, and the same processes as described with reference to FIGS. 8B through 8D may be performed.

Furthermore, when it is intended to form the protruding anti-breakdown material layer 440 as shown in FIG. 5, a different fabrication method than described above may be required. FIGS. 10A through 10D are cross-sectional views illustrating stages in a method of fabricating an anti-fuse device 800 including the protruding anti-breakdown material layer 440 shown in FIG. 5.

Figure 10A:
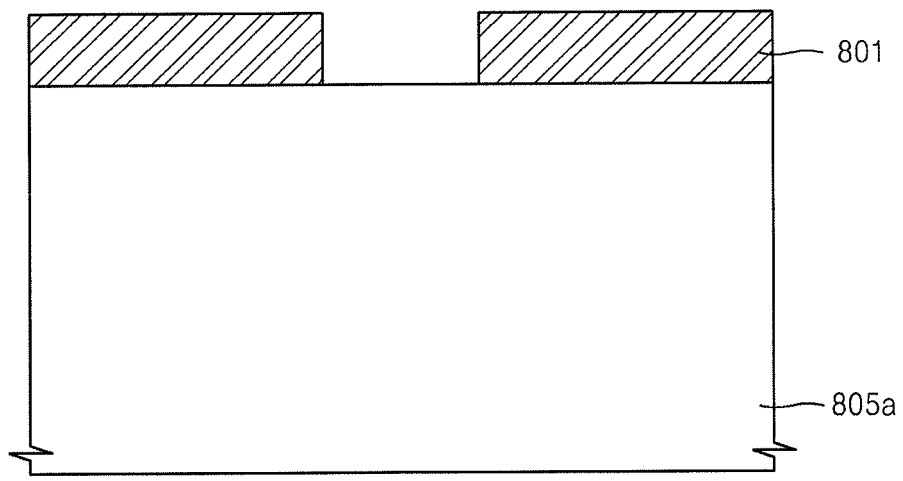
FIGS. 10A through 10D illustrate cross-sectional views of stages a method of fabricating an anti-fuse device according to another exemplary embodiment of the inventive concept.

To begin with, referring to FIG. 10A, a hard mask material layer (not shown) may be formed on a semiconductor substrate 805a and patterned using a PR mask, thereby forming a hard mask 801. The hard mask 801 shown in FIG. 10A may expose a portion of the semiconductor substrate 805a where an anti-breakdown material layer will be formed.

The hard mask material layer may be formed of any material having an etch selectivity with respect to the semiconductor substrate 805a and the anti-breakdown material layer without any particular limitation. For example, the hard mask material layer may be formed of silicon nitride or a spin-onhardmask (SOH). The height of the hard mask material layer may be appropriately determined in consideration of the protruding height of an anti-breakdown material layer to be formed later due to close relation therebetween.

The hard mask material layer may be formed using, e.g., an LPCVD process, a PECVD process, an MOCVD process, a MBE process, an RTCVD process, an LRP-CVD process, an ALD process, an IBD process, or an EBID process. In particular, the hard mask material layer may be formed of SOH using a spin coating process.

Figure 10B:
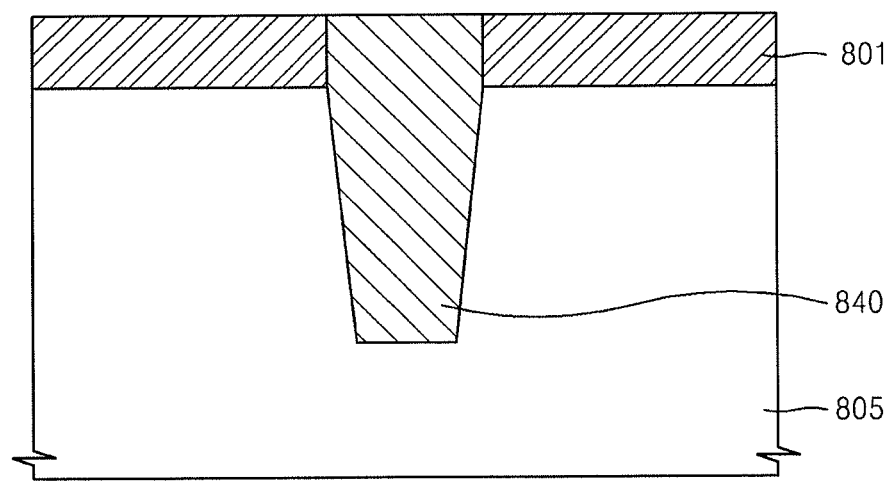

Referring to FIG. 10B, a trench may be formed by anisotropically etching a portion exposed by the hard mask 801 and filled with an insulating material. The insulating material may partially or wholly cover a top surface of the hard mask 801. The insulating material may be, e.g., silicon oxide, but the inventive concept is not limited thereto. Thereafter, a top surface of the insulating material may be planarized using a CMP or etchback process to define the insulating material within a trench, thereby forming an anti-breakdown material layer 840.

Figure 10C:
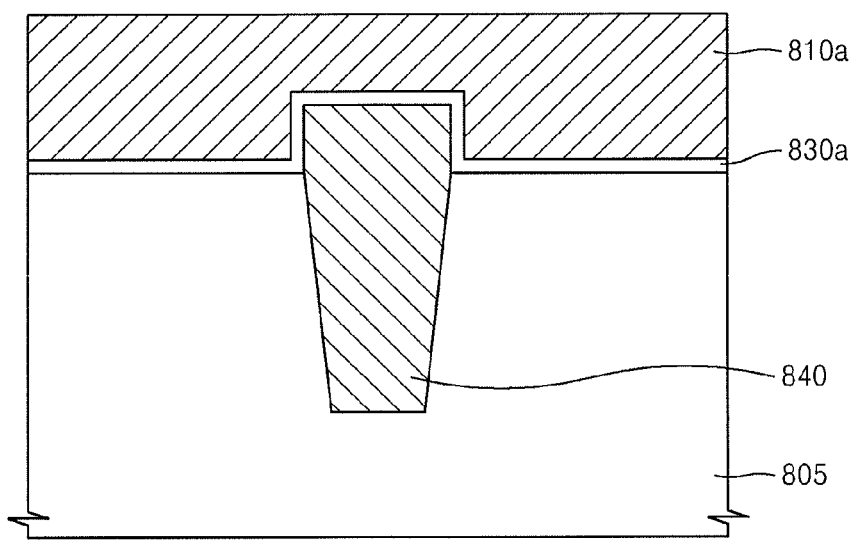

Referring to FIG. 10C, after the hard mask 801 is removed, a gate insulating material layer 830a and a gate electrode material layer 810a may be sequentially stacked on the entire surface on the resultant structure from which the hard mask 801 is removed. The removal of the hard mask 801 may be performed using an etching process or ashing process according to a material forming the hard mask 801, but the inventive concept is not limited thereto. The gate insulating material layer 830a may be formed conformally on the upper surface of the substrate 805 and the exposed surface of the anti-breakdown material layer 840.

The gate insulating material layer 830a may be a silicon oxide layer and formed using an LPCVD process, a PECVD process, an MOCVD process, a MBE process, an RTCVD process, an LRP-CVD process, an ALD process, an IBD process, or an EBID process. Alternatively, the gate insulating material layer 830a may be formed by thermally oxidizing the exposed surface of the semiconductor substrate 805.

The gate electrode material layer 810a may be formed of poly-Si, a metal, e.g., at least one of Cu, Pt, Ag, Au, Ru, Ir, Rh, Re, and AlCu alloy, a metal nitride, e.g., AlN and/or WN, a metal silicide, e.g., WSi and/or PtSi, carbon nanotubes, or a combination thereof. The gate electrode 110 may be formed using a sputtering process, an LPCVD process, a PECVD process, an MOCVD process, a MBE process, an RTCVD process, an LRP-CVD process, an ALD process, an IBD process, or an EBID process.

Figure 10D:
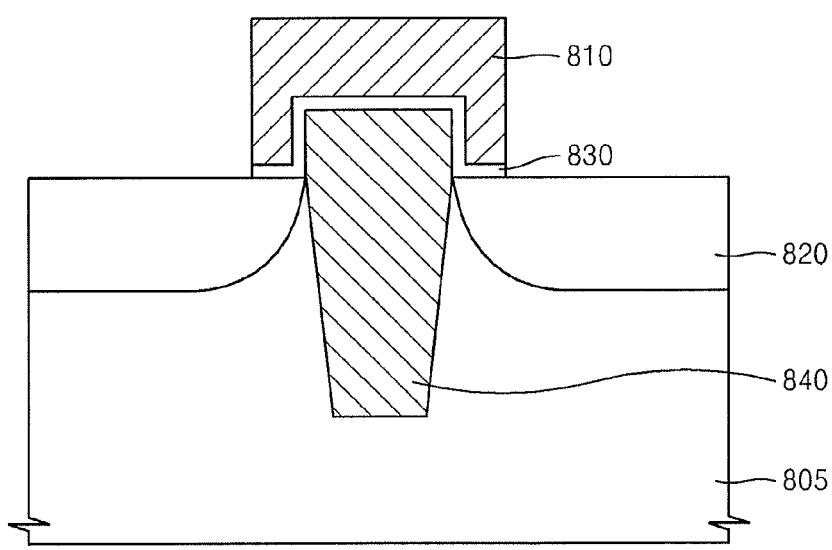

Referring to FIG. 10D, the gate electrode material layer 810a and the gate insulating material layer 830a may be anisotropically etched using a photolithography process, thereby simultaneously forming a gate electrode 810 and a gate insulating layer 830 in a self-aligned manner. Next, impurities may be heavily doped using the gate electrode 810 as an ion implantation mask and thermally diffused using an annealing process, thereby forming a junction region 820.

Figure 11:
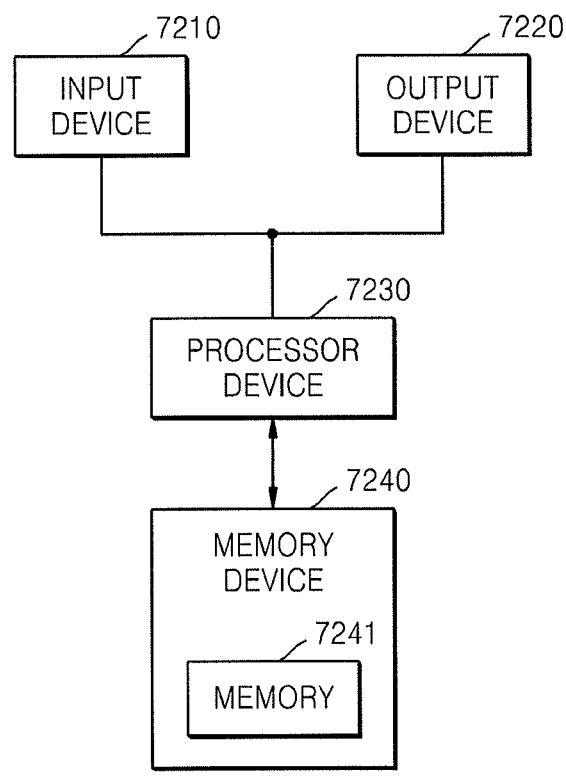
FIG. 11 illustrates a block diagram of an applied example of an electronic system including a semiconductor device according to an exemplary embodiment of the inventive concept.

FIG. 11 is a block diagram of an applied example of an electronic system 7200 including a semiconductor device according to an exemplary embodiment of the inventive concept. Referring to FIG. 11, the electronic system 7200 may include an input device 7210, an output device 7220, a processor device 7230, and a semiconductor memory device 7240. The semiconductor memory device 7240 may include a memory 7241 and a memory controller (not shown) configured to drive the memory 7241. The processor device 7230 may control the input device 7210, the output device 7220, and the semiconductor memory device 7240 through respectively corresponding interfaces.

The memory 7241 may include any one of the semiconductor devices according to the embodiments of the inventive concept. During the operation of the electronic system 7200, power may be applied to the memory 7241 under the control of the processor device 7230, and data stored in a fuse array of the memory 7241 may be read to set operating circumstances of the semiconductor memory device 7240.

Figure 12:
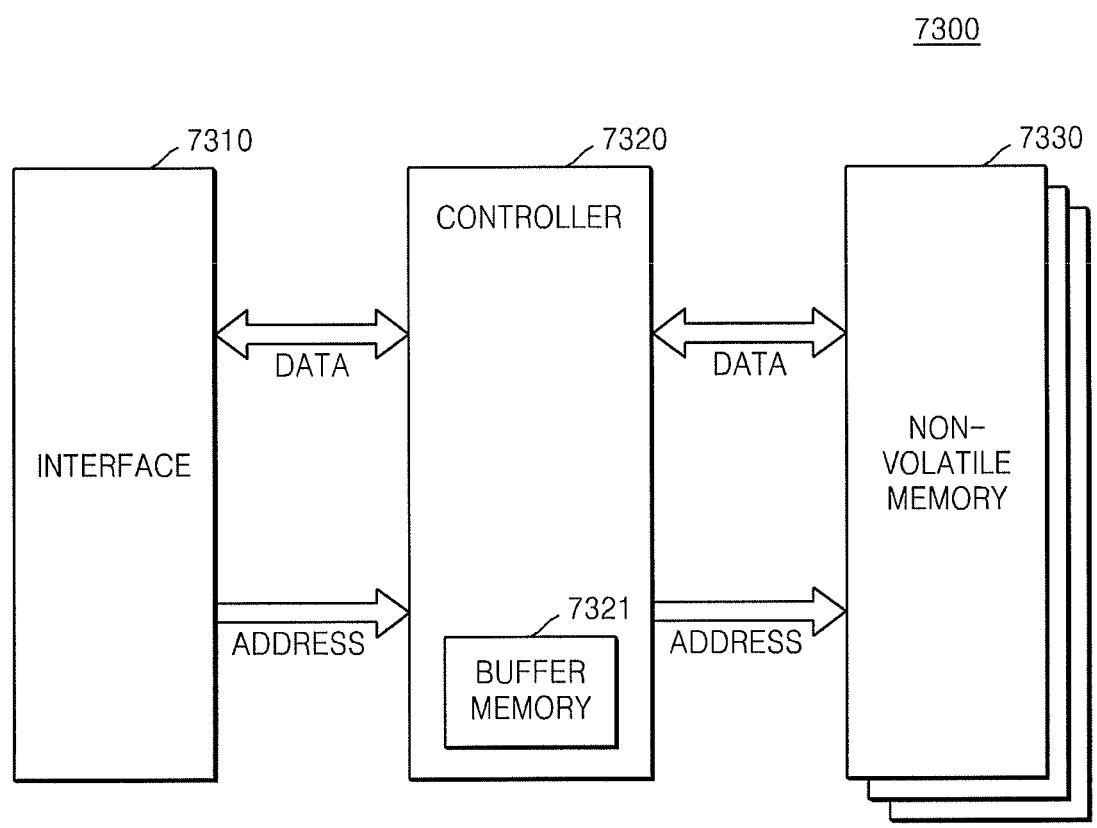
FIG. 12 illustrates a block diagram of an applied example of a memory card using a semiconductor device according to an exemplary embodiment of the inventive concept.

FIG. 12 is a block diagram of an applied example of a memory card 7300 including a semiconductor device according to an exemplary embodiment of the inventive concept. Referring to FIG. 12, the memory card 7300 may include an interface unit 7310, a controller 7320, and a semiconductor memory device 7330.

The interface unit 7310 may interface with the memory card 7300 and a host (not shown). The interface unit 7310 may include a data exchange protocol corresponding to the host so that the interface unit 7310 can interface with the host. The interface unit 7310 may communicate with the host through one of various interface protocols, such as a universal serial bus (USB), a multi-media card (MMC), a peripheral component interconnect-express (PCI-E), a serial-attached SCSI (SAS), a serial advanced technology attachment (SATA), a parallel advanced technology attachment (PATA), a small computer system interface (SCSI), an enhanced small disk interface (ESDI), and an integrated drive electronics (IDE).

The controller 7320 may externally receive data and addresses through the interface unit 7310. The controller 7320 may access the semiconductor memory device 7330 with reference to data and addresses transmitted from the host. The controller 7320 may transmit data read from the semiconductor memory device 7330 through the interface unit 7310 to the host. The controller 7320 may include a buffer memory 7321.

Write data transmitted from the host or the data read from the semiconductor memory device 7330 may be temporarily stored in the buffer memory 7321. When data of the semiconductor memory device 7330 is cached, the buffer memory 7321 may support a cache function to directly transmit cached data to the host with the read request from the host. In general, a data transmission rate of a bus format (e.g., SATA or SAS) of the host may be far faster than a transmission rate of a memory channel of the memory card 7300. That is, when an interface speed of the host is very fast, the buffer memory 7321 may be provided to minimize degradation of performance caused by a difference in speed.

The semiconductor memory device 7330 may be provided as a storage medium of the memory card 7300. For example, the semiconductor memory device 7330 may be embodied by a resistive memory device. Alternatively, the semiconductor memory device 7330 may be embodied by a NAND-type flash memory having mass storage capability. The semiconductor memory device 7330 may include a plurality of memory devices. In this case, each of the semiconductor memory devices may be connected to the controller 7320 in channel units. The semiconductor memory device 7330 serving as a storage medium may be a phase-change random access memory (PRAM), a magnetic RAM (MRAM), a resistive random access memory (ReRAM), a ferroelectric RAM (FRAM), a NOR flash memory, or a memory system including a combination of different memory devices. Also, anti-fuse devices according to exemplary embodiments of the inventive concept may be applied to the memory card 7300. For example, the semiconductor memory device 7330 may include an array of anti-fuse devices. In this case, when the memory card 7300 starts to be driven, data stored in the array of the anti-fuse devices may be read to set operating circumstances of the semiconductor memory device 7330.

Figure 13:
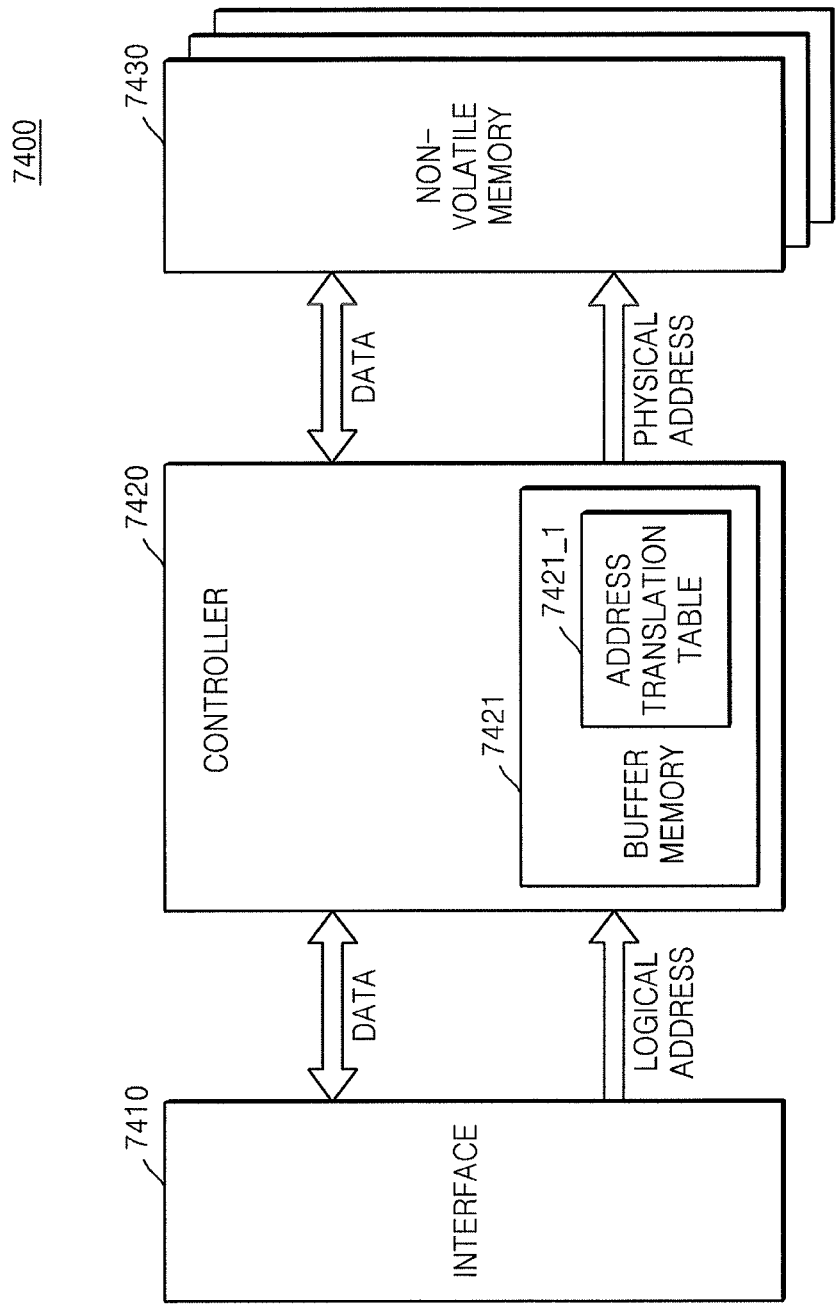
FIG. 13 illustrates a block diagram of an applied example of a memory card according to another exemplary embodiment of the inventive concept.

FIG. 13 is a block diagram of an applied example of a memory card 7400 according to another exemplary embodiment of the inventive concept. Referring to FIG. 13, the memory card 7400 may include an interface unit 7410, a controller 7420, and a semiconductor memory device 7430. Since the interface unit 7410 and the semiconductor memory device 7430 may have substantially the same configurations as those of FIG. 12, a description thereof will be omitted.

The controller 7420 may include a buffer memory 7421 including an address translation table 7421_1. The controller 7420 may translate a logical address provided from the interface unit 7410 into a physical address with reference to the address translation table 7421_1. The controller 7420 may access the semiconductor memory device 7430 with reference to the translated physical address.

Each of the memory cards 7300 and 7400 shown in FIGS. 12 and 13 may be mounted in a data processing apparatus, such as a digital camera, a portable media player (PMP), a mobile phone, a notebook computer. Each of the memory cards 7300 and 7400 may further include an MMC card, a secure digital (SD) card, a micro-SD card, a memory stick, an ID card, a personal computer memory card international association (PCMCIA) card, a chip card, a USB card, a smart card, or a compact flash (CF) card.

Figure 14:
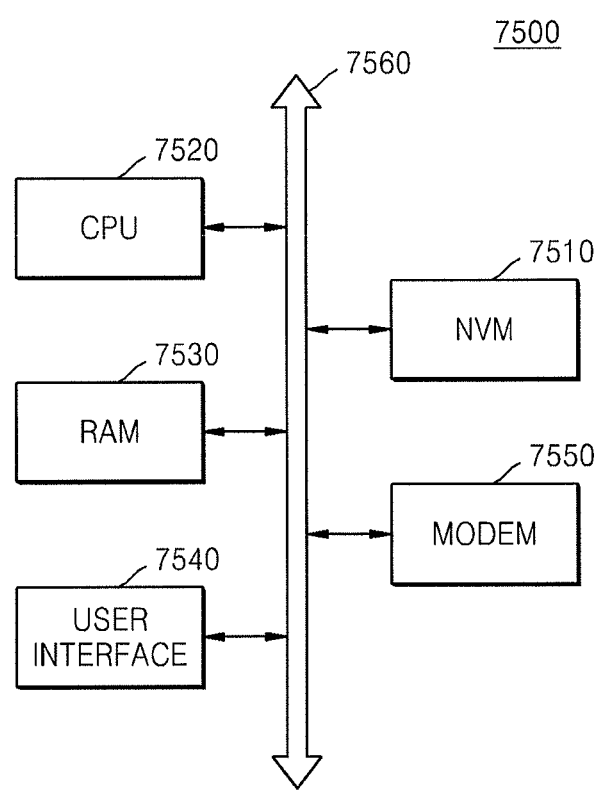
FIG. 14 illustrates a block diagram of a computing system including a memory device or a memory system according to an exemplary embodiment of the inventive concept.

FIG. 14 is a block diagram of a computer system 7500 including a memory device or memory system according to an exemplary embodiment of the inventive concept. The computer system 7500 according to the inventive concept may include a microprocessor (MP) 7520 electrically connected to a system bus 7560, a RAM 7530, a user interface 7540, a modem 7550 such as a baseband chipset, and a memory system 7510.

The memory system 7510 or the RAM 7530, which may store or output data, may include various logic circuits to drive them. When the computing system 7500 according to the inventive concept is a mobile device, a battery (not shown) configured to supply an operating voltage to the computing system 7500 may be further provided. Although not shown in FIG. 14, it would be apparent to those skilled in the art that the computing system 7500 according to the inventive concept may further include an application chipset, a camera image processor (CIP), or a mobile dynamic RAM (mobile DRAM). The memory system 7510 may constitute, for example, a solid-state drive/disk (SSD) configured to store data using a nonvolatile memory device. Alternatively, the memory system 7510 may be provided as a fusion flash memory, in which, for example, an SRAM buffer, a NAND flash memory, and a NOR interface logic are combined.

A semiconductor device according to an exemplary embodiment of the inventive concept may be applied to some of components included in the computing system 7500. For instance, when the computing system 7500 starts, operating circumstances of the memory system 7510 or the RAM 7530 may be set according to the above-described embodiment of the inventive concept. Each of the memory system 7510 or the RAM 7530 may include an array of anti-fuse devices.

A semiconductor device and/or system according to the inventive concept may be mounted using packages having various packages, for example, a package on package (PoP), a ball grid array (BGA), a chip-scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flatpack (TQFP), a small outline integrated circuit (SOIC), a shrink small outline package (SSOP), a thin small outline package (TSOP), a thin quad flatpack (TQFP), a system in package (SIP), a multi-chip package (MCP), a wafer-level fabricated package (WFP), or a wafer-level processed stack package (WSP).

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An anti-fuse device, comprising:
   a gate electrode over a semiconductor substrate;
   a gate insulating layer between the semiconductor substrate and the gate electrode;
   junction regions in the semiconductor substrate adjacent the gate electrode; and
   at least one anti-breakdown structure between the junction regions, the gate insulating layer being between the gate electrode and the at least one anti-breakdown material structure, wherein an upper surface of the at least one anti-breakdown material structure is substantially coplanar with the semiconductor substrate.

2. The device as claimed in claim 1, wherein the at least one anti-breakdown material structure includes at least one of silicon oxide, silicon nitride, and silicon oxynitride.

3. The device as claimed in claim 1, wherein the at least one anti-breakdown material structure is an ion implantation region having an opposite conductivity type to a conductivity type of the junction regions.

4. The device as claimed in claim 1, wherein at least a portion of an upper edge of the at least one anti-breakdown material structure contacts the junction regions.

5. The device as claimed in claim 1, wherein an upper edge of the at least one anti-breakdown material structure is spaced apart from the junction regions.

6. The device as claimed in claim 1, wherein at least a portion of each of the junction regions is overlapped by the gate electrode and gate insulation layer.

7. The device as claimed in claim 1, wherein at least two anti-breakdown material structures are positioned in the semiconductor substrate to overlap the third region of the gate insulating layer.

8. The device as claimed in claim 1, wherein a width of the at least one anti-breakdown material structure is about 60% or greater of a distance between the junction regions.

9. The device as claimed in claim 1, wherein the anti-breakdown material structure directly contacts the third region of the gate insulating layer.

10. The device as claimed in claim 1,
    wherein the gate insulating layer has first, second, third, and fourth regions,
    the first and second regions overlapping respective ones of the junction regions,
    the third and fourth regions being located between the first and second regions,
    the third region overlapping the at least one anti-breakdown material structure, and the fourth region not overlapping the at least one anti-breakdown material structure.

11. A system, comprising:
a memory device including the anti-fuse device of claim 1; and
a microprocessor connected to the memory device through a system bus.

12. The device as claimed in claim 1, wherein at least portions of the junction regions are overlapped by the gate electrode.

13. The device as claimed in claim 12, wherein the first and second regions of the gate insulating layer are configured to have a breakdown due to a pulse voltage equal to or higher than a rupture voltage applied to the gate electrode.

14. A semiconductor device, comprising:
a semiconductor substrate divided into a cell region and an anti-fuse region, the cell region including memory cells, and the anti-fuse region including anti-fuse devices,
wherein each of the anti-fuse devices is connected to at least one memory cell and configured to enable the at least one memory cell by a breakdown, and
wherein each of the anti-fuse devices includes:
a gate electrode over the semiconductor substrate,
a gate insulating layer between the semiconductor substrate and the gate electrode,
junction regions in the semiconductor substrate adjacent the gate electrode, and
at least one anti-breakdown structure between the junction regions, the gate insulating layer being between the gate electrode and the at least one anti-breakdown material structure, wherein an upper surface of the at least one anti-breakdown material structure is substantially coplanar with the semiconductor substrate.

15. The device as claimed in claim 14, wherein:
the memory cells are isolated from one another by an isolation layer, and
the isolation layer has a same depth as the anti-breakdown material structure.

16. An anti-fuse device, comprising:
a gate electrode over a semiconductor substrate;
a gate insulating layer between the semiconductor substrate and the gate electrode;
junction regions in the semiconductor substrate adjacent the gate electrode; and
at least one anti-breakdown material structure in the semiconductor substrate, the gate insulating layer overlapping and contacting at least a portion of the anti-breakdown material, wherein an upper surface of the at least one anti-breakdown material structure is substantially coplanar with the semiconductor substrate.

17. The device as claimed in claim 16, wherein a width of the anti-breakdown material structure is substantially equal to or less than a distance between the junctions regions.

18. The device as claimed in claim 17, wherein the gate insulation layer directly contacts the anti-breakdown material structure.

19. The device as claimed in claim 17, wherein a portion of the gate insulating layer that overlaps the anti-breakdown material is different from a portion of the gate insulating layer that does not overlap the anti-breakdown material structure in the area between the junctions regions.

20. The device as claimed in claim 19, wherein the portion of the gate insulating layer that overlaps the anti-breakdown material structure is greater than the portion of the gate insulting layer that does not overlap the anti-breakdown material structure in the area between the junction regions.

* * * * *